United States Patent
Weber

(10) Patent No.: US 10,513,232 B2
(45) Date of Patent: Dec. 24, 2019

(54) ELECTRICAL CONNECTING DEVICE FOR TRANSMITTING ELECTRICAL ENERGY AND/OR DATA, ON-BOARD ELECTRICAL SYSTEM AND MOTOR VEHICLE

(71) Applicant: Bayerische Motoren Werke Aktiengesellschaft, Munich (DE)

(72) Inventor: Martin Weber, Altomuenster (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 123 days.

(21) Appl. No.: 15/471,638

(22) Filed: Mar. 28, 2017

(65) Prior Publication Data

US 2017/0197563 A1 Jul. 13, 2017

Related U.S. Application Data

(63) Continuation of application No. PCT/EP2015/068719, filed on Aug. 14, 2015.

(30) Foreign Application Priority Data

Sep. 29, 2014 (DE) .................. 10 2014 219 645

(51) Int. Cl.
*B60L 1/00* (2006.01)
*H02G 3/00* (2006.01)
(Continued)

(52) U.S. Cl.
CPC ............. *B60R 16/023* (2013.01); *H04B 3/56* (2013.01); *H05K 5/0017* (2013.01);
(Continued)

(58) Field of Classification Search
CPC .. B60R 16/023; H05K 9/0098; H05K 5/0017; H05K 9/0064; H04B 2203/547; H04B 3/56
See application file for complete search history.

(56) References Cited

U.S. PATENT DOCUMENTS 7,841,898 B1 11/2010 Titus
8,624,427 B2 1/2014 Steffka et al.
(Continued)

FOREIGN PATENT DOCUMENTS

CN 101312869 A 11/2008
CN 102233825 A 11/2011
(Continued)

OTHER PUBLICATIONS

PCT/EP2015/068719, International Search Report dated Nov. 3, 2015 (Two (2) pages).

(Continued)

*Primary Examiner* — Alfonso Perez Borroto
*Assistant Examiner* — Esayas G Yeshaw
(74) *Attorney, Agent, or Firm* — Crowell & Moring LLP

(57) ABSTRACT

An electrical connecting device includes an electrical conductor configured to transmit at least one of electrical energy and data between a first electrical component, which is arranged in a first housing that is electrically connected to a reference potential, and a second electrical component, which is arranged in a second housing that is electrically connected to the reference potential. The electrical connecting device also includes a first shielding device configured to shield the electrical conductor, wherein the first shielding device is electrically connected to the first housing, and a second shielding device configured to shield the electrical conductor, wherein the second shielding device is electrically connected to the second housing. The first shielding device is electrically isolated from the second shielding device.

17 Claims, 2 Drawing Sheets

(51) Int. Cl.
*B60R 16/023* (2006.01)
*H05K 9/00* (2006.01)
*H04B 3/56* (2006.01)
*H05K 5/00* (2006.01)

(52) U.S. Cl.
CPC ......... *H05K 9/0064* (2013.01); *H05K 9/0098* (2013.01); *H04B 2203/547* (2013.01)

(56) References Cited

U.S. PATENT DOCUMENTS

| | | | | |
|---|---|---|---|---|
| 2006/0021786 A1* | 2/2006 | Fetterolf, Sr. | ......... | H01B 9/003 174/113 R |
| 2007/0182429 A1* | 8/2007 | Goeke | ................. | G01R 1/0416 324/755.02 |
| 2010/0000780 A1 | 1/2010 | Zhu et al. | | |
| 2015/0034358 A1* | 2/2015 | Armbrecht | ........... | H01B 11/005 174/103 |
| 2015/0114711 A1* | 4/2015 | Dew | ................. | H02G 15/1806 174/72 A |
| 2016/0094051 A1* | 3/2016 | Soar | ..................... | H04B 5/0031 307/9.1 |
| 2016/0178674 A1* | 6/2016 | Mollier | .............. | G01R 19/2513 702/65 |
| 2016/0306001 A1* | 10/2016 | Taylor | .................. | G01R 31/026 |

FOREIGN PATENT DOCUMENTS

| | | |
|---|---|---|
| CN | 103703520 A | 4/2014 |
| DE | 10 2011 004 457 A1 | 1/2012 |
| EP | 1 793 207 A1 | 6/2007 |
| EP | 2 736 050 A1 | 5/2014 |
| WO | WO 2007/057757 A1 | 5/2007 |

OTHER PUBLICATIONS

Chinese Office Action issued in Chinese counterpart application No. 201580032351.3 dated Jan. 8, 2019, with English translation (Fifteen (15) pages).

Chinese Office Action issues in Chinese counterpart application No. 201580032351.3 dated May 14, 2019, with English translation (Fourteen (14) pages).

* cited by examiner

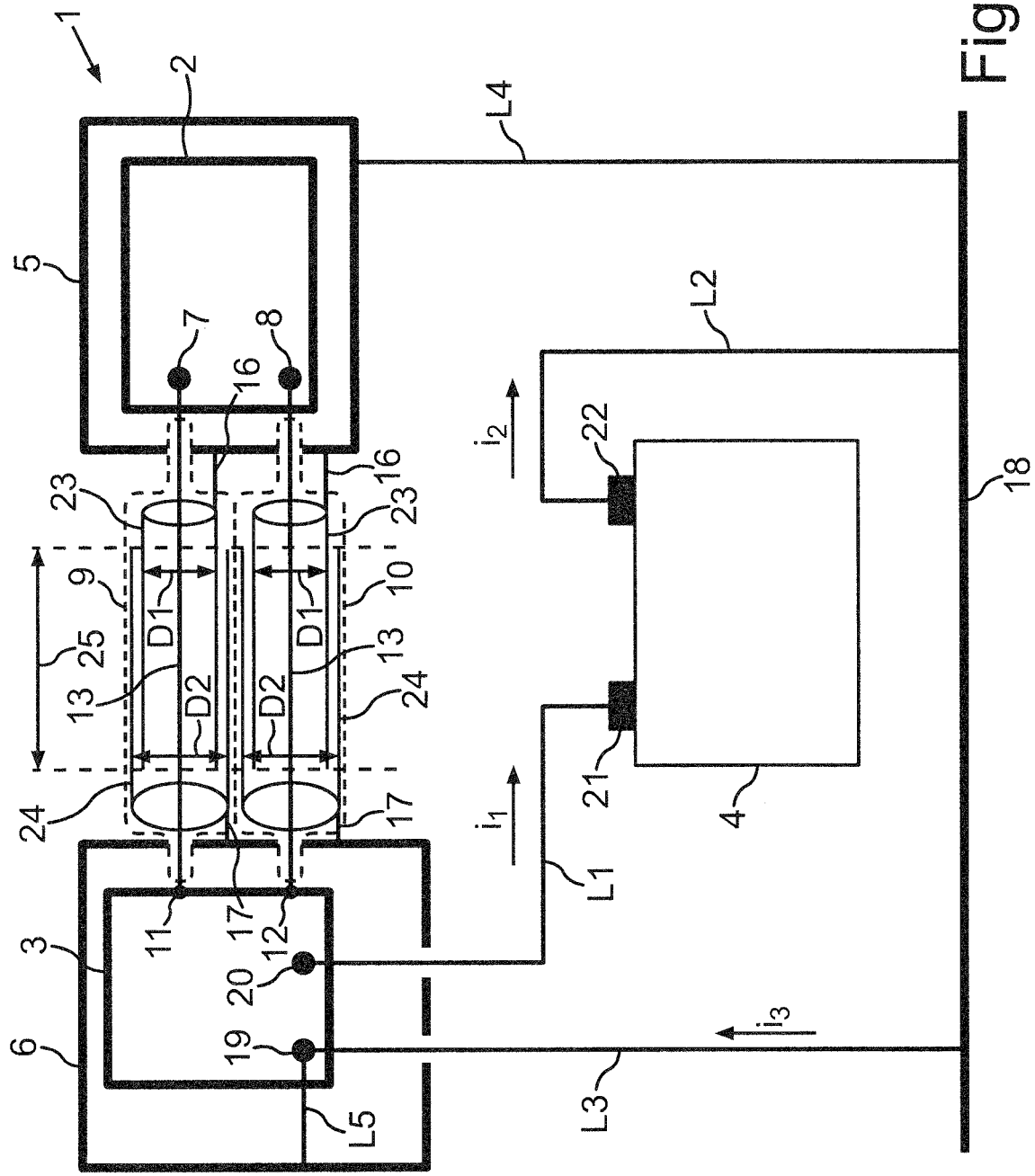

ELECTRICAL CONNECTING DEVICE FOR TRANSMITTING ELECTRICAL ENERGY AND/OR DATA, ON-BOARD ELECTRICAL SYSTEM AND MOTOR VEHICLE

CROSS REFERENCE TO RELATED APPLICATIONS

This application is a continuation of PCT International Application No. PCT/EP2015/068719, filed Aug. 14, 2015, which claims priority under 35 U.S.C. § 119 from German Patent Application No. 10 2014 219 645.0, filed Sep. 29, 2014, the entire disclosures of which are herein expressly incorporated by reference.

BACKGROUND AND SUMMARY OF THE INVENTION

The invention relates to an electrical connecting device for transmitting electrical energy and/or data between a first electrical component, which is arranged in a first housing which is electrically connected to a reference potential, and a second electrical component, which is arranged in a second housing which is electrically connected to the reference potential. The invention also relates to an on-board electrical system comprising an electrical connecting device, and to a motor vehicle comprising an on-board electrical system.

Electrical connecting devices can be embodied as cables and serve to transmit energy and/or data between electrical components. Electrical components of this kind can be components of an on-board electrical system of a motor vehicle, for example electrical energy stores for providing electrical energy, control units, communication devices, display elements or electric motors.

An electrical connecting device or cable usually comprises an electrical conductor, for example a wire or braids. For reasons of electromagnetic compatibility (EMC), the electrical conductors generally have a shield. Therefore, undesired electrical or electromagnetic effects, for example coupling in or emitting electrical or electromagnetic fields, can be avoided. To this end, the shield is connected to a reference potential, for example the reference potential of the motor vehicle, at both ends of the cable.

This has the disadvantage that so-called ground loops can be produced by uncontrolled currents flowing across the shields of the conductors, said uncontrolled currents, for their part, possibly causing interference in respect of electromagnetic compatibility. When there is a defect in the connection to the vehicle ground or when there is a faulty ground connection, currents which are so high that the motor vehicle may be damaged can flow in the process. This is problematical primarily when transmitting high-voltage energy via the lines since electrical high-voltage components generally have a high current consumption and/or can provide a high current.

An object of the invention is to realize an electrical connecting device by means of which ground loops and uncontrolled flow of currents can be safely and reliably avoided.

According to the invention, this object is achieved by an electrical connecting device, an on-board electrical system and also a motor vehicle having the features as claimed in the respective independent patent claims. Advantageous embodiments of the invention are the subject matter of the dependent patent claims, the description and the figures.

An electrical connecting device according to the invention comprising an electrical conductor serves to transmit electrical energy and/or data between a first electrical component, which is arranged in a first housing, and a second electrical component, which is arranged in a second housing, wherein the first housing is electrically connected to a reference potential, and the second housing is electrically connected to the reference potential. According to the invention, the electrical connecting device has a first shielding device for shielding the electrical conductor, wherein the first shielding device can be electrically connected to the first housing, and a second shielding device for shielding the electrical conductor, wherein the second shielding device can be electrically connected to the second housing, and wherein the first shielding device is electrically isolated from the second shielding device.

In other words, this means that the first electrical component can be electrically connected to the second component by means of the electrical conductor of the electrical connecting device, so that data and/or energy can flow between the electrical components. The electrical connecting device can be embodied as at least one cable which comprises the electrical conductor, for example in the form of a wire or in the form of braids. The first electrical component and the second electrical components are each arranged in a housing, wherein each of the two housings is connected to a reference potential.

In order to protect the electrical connecting device against interfering influences, the electrical connecting device has a first shielding device and a second shielding device. In this case, the first shielding device can be connected to the first housing and therefore also to the reference potential of the motor vehicle. The second shielding device can be connected to the second housing and therefore likewise to the reference potential of the motor vehicle. The first shielding device and the second shielding device can, for example, be woven one into the other and in the process electrically isolated from one another. Since the first shielding device and the second shielding device are electrically isolated from one another, no undesired current can flow across the first shielding device and the second shielding device between the first housing and the second housing. Therefore, the cable is shielded in a bidirectional manner by means of the two shielding devices. In particular, a so-called ground loop, that is to say an electrical circuit which comprises the reference potential, the first and the second housing, and the first and the second shielding device, can be avoided. Damage to the electrical components or danger to persons is advantageously prevented by virtue of this electrical isolation.

In a preferred refinement, the first shielding device and/or the second shielding device are of substantially hollow-cylindrical design, wherein the first shielding device has a first diameter and the second shielding device has a second diameter which is larger than the first diameter. A hollow-cylindrical shielding device of this kind can be a sheath which can surround the electrical conductor of the electrical connecting device, which electrical conductor is embodied as a wire or braid for example. In this case, the first, hollow-cylindrical shielding device can be electrically connected to the first housing and extend over a first conductor subregion in the direction of the second housing at one of the ends of the first shielding device. The first conductor subregion of the electrical connecting device therefore has a concentric design which comprises the at least one electrical conductor and the first, hollow-cylindrical shielding device. In this case, the second, hollow-cylindrical shielding device can be electrically connected to the second housing and extend over a second conductor subregion in the direction of the first housing at one of the ends of the second shielding device. The second conductor subregion of the electrical connecting device therefore likewise has a concentric design which comprises the at least one electrical conductor and the second, hollow-cylindrical shielding device. A hollow-cylindrical shielding device of this kind can be formed in a particularly simple manner.

It has proven advantageous when the first shielding device and/or the second shielding device are formed from an electrically conductive material, in particular a metal. Therefore, electrical and/or electromagnetic fields can be shielded in a particularly effective and efficient manner, so that electrical energy and/or data can be transmitted with a low level of interference.

The second shielding device preferably surrounds the first shielding device at least in regions in a predetermined overlap region. In this case, the overlap region can be located between the first conductor subregion and the second conductor subregion. Since the second shielding device preferably has a larger diameter than the first shielding device, the overlap region of the electrical connecting device has a concentric design which comprises the electrical conductor, the first shielding device and the second shielding device. In the predetermined overlap region, the hollow-cylindrical shielding devices therefore run one over the other. In particular, the electrical connecting device is doubly shielded in the predetermined overlap region. Since the first shielding device is electrically connected to the first housing and the second shielding device is electrically connected to the second housing, the electrical connecting device is shielded in a bidirectional manner in particular.

Provision can be made for an electrical insulation element for electrically isolating the first and the second shielding device to be arranged between the first and the second shielding device in the overlap region. An insulation element of this kind can be an insulating casing which is likewise of hollow-cylindrical design. Provision can also be made for the first shielding device to be integrated into a cable sheath which is composed of an insulating material and has a first diameter. The second shielding device can likewise be integrated into a cable sheath which is composed of the insulating material and has a second diameter which is larger than the first diameter. The cable sheaths can be guided one over the other in a particularly simple manner in the overlap region. In this case, the insulating material of the cable sheaths forms the electrical insulation element which electrically isolates the first shielding device from the second shielding device which runs, in particular, over the first shielding device.

The invention also includes an on-board electrical system for a motor vehicle comprising at least one electrical connecting device according to the invention. In addition, the on-board electrical system comprises a first electrical component, which is arranged in a first housing, and a second electrical component, which is arranged in a second housing, wherein the first electrical component is electrically connected to the second component by means of the at least one electrical connecting device, and wherein the first housing is electrically connected to a reference potential and the second housing is electrically connected to the reference potential. In this case, the first shielding device of the at least one electrical connecting device according to the invention is electrically connected to the first housing, and the second shielding device is electrically connected to the second housing. Ground loops and uncontrolled flow of currents across the shielding devices can be avoided by electrically isolating the first shielding device from the second shielding device.

The on-board electrical system particularly preferably comprises at least one third electrical component which is electrically connected to the first and/or the second electrical component. The on-board electrical system can therefore be extended by any desired number of electrical components and is very safe and reliable owing to the electrical isolation of the first shielding device from the second shielding device.

In an advantageous embodiment, the first electrical component is embodied as a high-voltage battery and/or the second electrical component is embodied as a voltage converter and/or the third electrical component is embodied as a low-voltage battery, wherein a negative pole of the low-voltage battery is electrically connected to the reference potential of the motor vehicle and a positive pole of the low-voltage battery is electrically connected to the voltage converter. The high-voltage battery, which provides a high voltage, is connected to the voltage converter, for example a DC/DC converter, by means of the at least one electrical conductor. Here, a high voltage is intended to be understood to be an electrical voltage of greater than 60 volts. The voltage converter can be designed to convert the high voltage into a low voltage for charging the low-voltage battery. Here, a low voltage is intended to be understood to be an electrical voltage of less than 60 volts. To this end, the voltage converter is electrically connected to a positive pole of the low-voltage battery. The negative pole of the low-voltage battery is connected to the reference potential of the motor vehicle. This means that the vehicle ground is the negative potential of the low-voltage battery. The low-voltage battery is electrically connected to the first housing, in which the high-voltage battery is arranged, by means of the ground connection, and is electrically connected to the second housing, in which the voltage converter is arranged. Owing to the electrical isolation of the first shielding device and the second shielding device, it is advantageously possible to prevent an electric current, which is provided by the low-voltage battery, from flowing between the first and the second housing, for example in the case of a defective ground connection.

As an alternative, the first component and/or the second component are communication devices, wherein the electrical connecting device is designed to transmit data between the first component and the second component. The transmission of data can be ensured with a particularly low level of interference and in a reliable manner by avoiding ground loops by means of the electrical isolation of the shielding device.

The invention also includes a motor vehicle comprising an on-board electrical system according to the invention. The motor vehicle is embodied, in particular, as a passenger car.

The preferred embodiments presented with reference to the electrical connecting device according to the invention apply in a corresponding manner to the on-board electrical system according to the invention and to the motor vehicle according to the invention.

Further features of the invention can be gathered from the claims, the figures and the description of the figures. The features and combinations of features mentioned above in the description and the features and combinations of features mentioned below in the description of the figures and/or shown in the figures alone can be used not only in the respectively indicated combination but also in other combinations or on their own.

The invention will now be explained in greater detail on the basis of a preferred exemplary embodiment and with reference to the drawings, in which:

Other objects, advantages and novel features of the present invention will become apparent from the following detailed description of one or more preferred embodiments when considered in conjunction with the accompanying drawings.

BRIEF DESCRIPTION OF THE DRAWINGS

FIG. 2 is a schematic illustration of an on-board electrical system according to the invention comprising one embodiment of an electrical connecting device according to the invention.

DETAILED DESCRIPTION OF THE DRAWINGS

Figure 1:
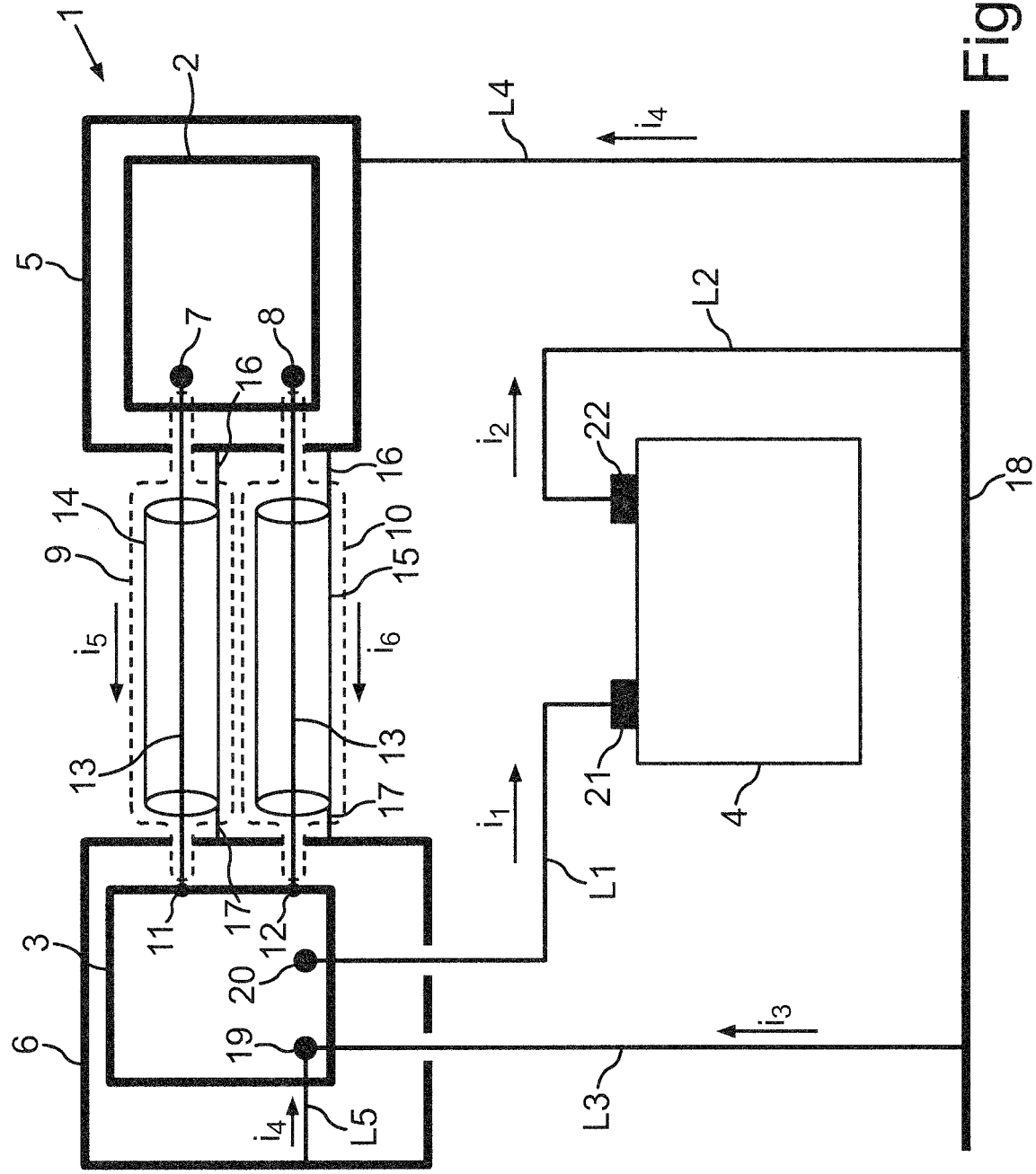
FIG. 1 is a schematic illustration of an on-board electrical system according to the prior art.

Identical elements or elements with the same function are provided with the same reference symbols in the figures.

FIG. 1 shows an on-board electrical system 1 for a motor vehicle (not illustrated here) according to the prior art. In the present case, the on-board electrical system 1 has a first electrical component 2, a second electrical component 3 and a third electrical component 4. Here, the first electrical component 2 is embodied as a high-voltage battery which provides a high voltage. Here, the second electrical component 3 is embodied as a voltage converter, in particular as a DC/DC converter, which can convert the high voltage of the high-voltage battery, for example, into a low voltage. Here, the third electrical component 4 is embodied as a low-voltage battery. However, the first component 2 and the second component 3 can also be embodied as communication devices, for example as transmitters, receivers and/or control units.

The first electrical component 2 is arranged in a first housing 5. Here, the second electrical component 3 is embodied as a four-terminal network and is arranged in a second housing 6. A positive pole 7 of the high-voltage battery is connected to a first input terminal 11 of the four-terminal network by means of a first electrical connecting device 9. A negative pole 8 is connected to a second input terminal 12 of the four-terminal network by means of a second electrical connecting device 10. Each of the electrical connecting device 9 and 10 can be embodied as a cable and have an electrical conductor 13 by means of which electrical energy and can flow between the first electrical component 2 and the second electrical component 3. If the electrical components 2 and 3 are embodied as communication devices, data can also be interchanged between the components 2, 3 and 4 by means of the electrical conductor 13.

The first electrical connecting device 9 has a first shielding sheath 14. The second electrical connecting device 10 has a second shielding sheath 15. Each of the shielding sheaths 14 and 15 is electrically connected to the first housing 5 by means of an electrical coupling element 16. In addition, each of the shielding sheaths 14 and 15 is electrically connected to the second housing 6 by means of a further electrical coupling element 17. Owing to the electrical connection of the first shielding sheath 14 to the housings 5 and 6, a current $i_5$ can flow across the first shielding sheath 14 and therefore between the first housing 5 and the second housing 6. Owing to the electrical connection of the second shielding sheath 15 to the housings 5 and 6, a current $i_6$ can flow across the second shielding sheath 15 and therefore between the first housing 5 and the second housing 6.

The first housing 5 is connected to a reference potential 18 of the motor vehicle by means of an electrical line L4. Therefore, a current $i_4$ can flow between the first housing 5 and the reference potential 18 of the motor vehicle by means of the electrical line L4. The second housing 6 is electrically connected to a first output terminal 19 of the second electrical component 3, which is embodied as a four-terminal network, by means of an electrical line L5. The first output terminal 19 is connected to the reference potential 18 of the motor vehicle by means of an electrical line L3. Therefore, a current $i_3$ can flow between the first output terminal 19 and the reference potential 18 of the motor vehicle by means of the electrical line L3.

Since the current $i_4$, which can flow between the first housing 5 and the reference potential 18, is made up of a sum of the two currents $i_5$ and $i_6$, which can flow across the shielding sheaths 14 and 15 in the event of a defect in the ground connection L3 for example, in accordance with Kirchhoff's node law, the current $i_4$ can also flow across the second housing 6 between the second housing 6 and the first output terminal 19 of the four-terminal network ($i_4=i_5+i_6$). This current flow is undesired. Based on the current being maintained, the current $i_4$ corresponds to the current $i_3$ ($i_4=i_3$).

Here, the voltage converter has a second output terminal 20 which is connected to a positive pole 21 of the third electrical component 4, which is embodied as a low-voltage battery, by means of an electrical line L1. A current $i_1$ can flow between the second output terminal 20 and the positive pole 21 of the low-voltage battery. A negative pole 22 is connected to the reference potential 18 of the motor vehicle by means of an electrical line L2. A current $i_2$ can flow between the negative pole 20 and the reference potential 18 of the motor vehicle by means of the electrical line L2, said current being made up of a sum of the currents $i_3$ and $i_4$ ($i_2=i_3+i_4$). Based on the current being maintained, the current $i_1$ corresponds to the current $i_2$ ($i_1=i_2$).

The disadvantage of the on-board electrical system 1 shown in FIG. 1 is an undesired ground loop, that is to say an undesired electrically conductive connection which comprises the reference potential 18, the electrical lines L3, L4, L5, the first housing 5, the second housing 6, the shielding sheaths 14 and 15 and the coupling elements 16 and 17.

FIG. 2 shows, by way of example, an on-board electrical system 1 according to the invention with which an undesired ground loop can be avoided. In this case, each of the electrical connecting devices 9 and 10 has a first shielding device 23 and a second shielding device 24. The respectively first shielding device 23 is connected to the first housing 5 by means of the electrical coupling element 16. The respectively second shielding device 24 is connected to the second housing 6 by means of the electrical coupling element 17. The first shielding device 23, which surrounds the electrical conductor 13 of the first connecting device 9, is electrically isolated from the second shielding device 24, which surrounds the electrical conductor 13 of the first connecting device 9. In addition, the first shielding device 23, which surrounds the electrical conductor 13 of the second connecting device 10, is electrically isolated from the second shielding device 24, which surrounds the electrical conductor 13 of the second connecting device 10. The respectively first shielding devices 23 is therefore electrically isolated from the respectively second shielding devices 24. As a result, no current can flow across the shielding devices 23 and 24 between the first housing 5 and the second housing 6, in particular in the case of a faulty ground connection.

The respectively first shielding device 23 can be of hollow-cylindrical design, in particular, and have a first diameter D1. The respectively hollow-cylindrical first shielding device 23 surrounds or sheaths the electrical conductor 13 in this case. The respectively second shielding device 24 can likewise be of hollow-cylindrical design, in particular, and have a second diameter D2 which is, in particular, larger than the first diameter D1. The respectively hollow-cylindrical second shielding device 24 likewise surrounds or sheaths the electrical conductor 13 in this case. Here, the respectively second shielding device 23 can surround the respectively first shielding device 24 in a predetermined overlap region 25 in such a way that the connecting devices 9 and 10 are doubly shielded in the overlap region 25. However, it is also possible for the first shielding device 23 and the second shielding device 24 to be able to be woven one into the other for example and to be electrically isolated from one another in the process.

Therefore, the exemplary embodiment shows a bidirectionally shielded conductor for high-voltage and/or low-voltage applications and/or communication applications.

LIST OF REFERENCE SYMBOLS

1 On-board electrical system
2 First electrical component
3 Second electrical component
4 Third electrical component
5 First housing
6 Second housing
7 Positive pole
8 Negative pole
9 First electrical connecting device
10 Second electrical connecting device
11 First input terminal
12 Second input terminal
13 Electrical conductor
14 First shielding sheath
15 Second shielding sheath
16, 17 Electrical coupling element
18 Reference potential
19 First output terminal
20 Second output terminal
21 Positive pole
22 Negative pole
23 First shielding device
24 Second shielding device
25 Overlap region
L1, L2, L3, L4, L5 Electrical lines
D1 First diameter
D2 Second diameter
$i_1, i_2, i_3, i_4, i_5, i_6$ Electrical currents The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An electrical connecting device comprising:
an electrical conductor configured to transmit at least one of electrical energy and data between a first electrical component, which first electrical component is arranged in a first housing that is electrically connected to a reference potential, and a second electrical component, which second electrical component is arranged in a second housing that is electrically connected to the reference potential;
a first shielding device configured to shield the electrical conductor, wherein the first shielding device is electrically connected to the first housing by a first electrical coupling element; and
a second shielding device configured to shield the electrical conductor, wherein the second shielding device is electrically connected to the second housing by a second electrical coupling element,
wherein the first shielding device is electrically isolated from the second shielding device.

2. The electrical connecting device as claimed in claim 1, wherein at least one of the first shielding device and the second shielding device is of substantially hollow-cylindrical design, and
wherein the first shielding device has a first diameter and the second shielding device has a second diameter which is larger than the first diameter.

3. The electrical connecting device as claimed in claim 1, wherein at least one of the first shielding device and the second shielding device is formed from an electrically conductive material.

4. The electrical connecting device as claimed in claim 2, wherein at least one of the first shielding device and the second shielding device is formed from an electrically conductive material.

5. The electrical connecting device as claimed in claim 1, wherein the second shielding device surrounds the first shielding device at least in a predetermined overlap region.

6. The electrical connecting device as claimed in claim 2, wherein the second shielding device surrounds the first shielding device at least in a predetermined overlap region.

7. The electrical connecting device as claimed in claim 3, wherein the second shielding device surrounds the first shielding device at least in a predetermined overlap region.

8. The electrical connecting device as claimed in claim 5, further comprising an electrical insulation element configured to electrically isolate the first shielding device and the second shielding device, wherein the electrical insulation element is arranged between the first shielding device and the second shielding device in the predetermined overlap region.

9. The electrical connecting device as claimed in claim 6, further comprising an electrical insulation element configured to electrically isolate the first shielding device and the second shielding device, wherein the electrical insulation element is arranged between the first shielding device and the second shielding device in the predetermined overlap region.

10. The electrical connecting device as claimed in claim 7, further comprising an electrical insulation element configured to electrically isolate the first shielding device and the second shielding device, wherein the electrical insulation element is arranged between the first shielding device and the second shielding device in the predetermined overlap region.

11. An on-board electrical system for a motor vehicle, comprising:
an electrical connecting device including:
an electrical conductor configured to transmit at least one of electrical energy and data between a first electrical component, which first electrical component is arranged in a first housing that is electrically connected to a reference potential, and a second electrical component, which second electrical component is arranged in a second housing that is electrically connected to the reference potential,
a first shielding device configured to shield the electrical conductor, wherein the first shielding device is electrically connected to the first housing by a first electrical coupling element, and
a second shielding device configured to shield the electrical conductor, wherein the second shielding device is electrically connected to the second housing by a second electrical coupling element,
wherein the first shielding device is electrically isolated from the second shielding device,
wherein the first electrical component is electrically connected to the second component by the at least one electrical connecting device.

12. The on-board electrical system as claimed in claim 11, further comprising at least one third component which is electrically connected to at least one of the first electrical component and the second electrical component.

13. The on-board electrical system as claimed in claim 11, wherein the first electrical component is a voltage converter and/or the second electrical component is a high-voltage battery and/or the third electrical component is a low-voltage battery,
wherein a negative pole of the low-voltage battery is electrically connected to the reference potential of the motor vehicle and a positive pole of the low-voltage battery is electrically connected to the voltage converter.

14. The on-board electrical system as claimed in claim 12, wherein the first electrical component is a voltage converter and/or the second electrical component is a high-voltage battery and/or the third electrical component is a low-voltage battery,
wherein a negative pole of the low-voltage battery is electrically connected to the reference potential of the motor vehicle and a positive pole of the low-voltage battery is electrically connected to the voltage converter.

15. The on-board electrical system as claimed in claim 11, wherein at least one of the first component and the second component is a communication device,
wherein the electrical connecting device is configured to transmit data between the first component and the second component.

16. The on-board electrical system as claimed in claim 12, wherein at least one of the first component and the second component is a communication device,
wherein the electrical connecting device is configured to transmit data between the first component and the second component.

17. A motor vehicle comprising an on-board electrical system, wherein the on-board electrical system, comprising:
an electrical connecting device including:
an electrical conductor configured to transmit at least one of electrical energy and data between a first electrical component, which first electrical component is arranged in a first housing that is electrically connected to a reference potential, and a second electrical component, which second electrical component is arranged in a second housing that is electrically connected to the reference potential,
a first shielding device configured to shield the electrical conductor, wherein the first shielding device is electrically connected to the first housing by a first electrical coupling element, and
a second shielding device configured to shield the electrical conductor, wherein the second shielding device is electrically connected to the second housing by a second electrical coupling element,
wherein the first shielding device is electrically isolated from the second shielding device,
wherein the first electrical component is electrically connected to the second component by the at least one electrical connecting device.

* * * * *